United States Patent [19]
Davis et al.

[11] Patent Number: 5,206,074
[45] Date of Patent: Apr. 27, 1993

[54] ADHESIVES ON POLYIMIDE FILMS AND METHODS OF PREPARING THEM

[75] Inventors: Charles R. Davis, Endicott; Ashit A. Mehta, Vestal; Konstantinos Papathomas, Endicott; Lee P. Springer, Endicott; William J. Summa, Endicott; David W. Wang, Vestal, all of N.Y.

[73] Assignee: International Business Machines Corporation, Armonk, N.Y.

[21] Appl. No.: 657,795

[22] Filed: Feb. 20, 1991

Related U.S. Application Data

[60] Continuation-in-part of Ser. No. 380,195, Jul. 17, 1989, Pat. No. 5,015,719, which is a continuation-in-part of Ser. No. 154,861, Feb. 10, 1988, abandoned, which is a division of Ser. No. 33,557, Apr. 3, 1987, Pat. No. 4,745,215.

[51] Int. Cl.$^5$ .............................................. B32B 9/00
[52] U.S. Cl. ..................................... 428/209; 528/98; 528/70; 428/220; 428/901
[58] Field of Search .................... 528/70, 98; 428/220, 428/209, 901

[56]            References Cited
U.S. PATENT DOCUMENTS 4,725,484  2/1988  Kumagawa et al. ............. 428/473.5
4,745,215  5/1988  Cox et al. ........................... 560/301

FOREIGN PATENT DOCUMENTS 2189795  11/1987  United Kingdom .................. 528/98

Primary Examiner—Patrick J. Ryan
Assistant Examiner—Kam Lee
Attorney, Agent, or Firm—Richard M. Goldman

[57]            ABSTRACT

Disclosed is a polymeric product of diglycidyl bis phenol p-dialkyl benzene, and dicyanate diphenyl hexafluoro isopropane. Also disclosed is an organic polymeric dielectric composite of organic polymeric films, as polyimide films, dispersed in and reinforcing the organic polymeric adhesive reaction product of diglycidyl bis phenol p-dialkyl benzene, and dicyanate diphenyl hexafluoro isopropane. Further disclosed is an electronic circuit package that is adapted to receive at least one microelectronic circuit chip, with at least one layer having a substrate of an organic polymeric dielectric composite of organic polymeric films and the organic polymeric adhesive reaction product of diglycidyl bis phenol p-dialkyl benzene, and dicyanate diphenyl hexafluoro isopropane.

4 Claims, 3 Drawing Sheets

FIG.3
TABLE 1

| CYANATE WT % (RESIN) | EPXOY WT % (RESIN) | ADHESION LBS/IN (COMPOSITE TO CU) | DIELECTRIC CONSTANT (RESIN) | FLAM-IBILITY (RESIN) | ENLIGTION 250 300 CURE CURE (PERCENT) | | Tg DEG C (RESIN) | WEIGHT LOSS (%) † (RESIN) |
|---|---|---|---|---|---|---|---|---|
| 100 | 00 | 9.6 | 2.71 | V0 | --- | 2.5 | 290 | 0-0-X |
| 90 | 10 | --- | --- | V0 | 4.5 | 4.0 | 250 | 0-0-X |
| 80 | 20 | 9.2 | 2.94 | V0 | 4.5 | 5.0 | 220 | 0-0-4% |
| 70 | 30 | --- | 3.19 | V1 | 4.5 | 5.5 | 195 | 0-0-5% |
| 60 | 40 | 8.2 | 3.16 | BURNS | 3.0 | --- | 185 | 5%-X-X |

† WEIGHT LOSS IN PERCENT AT 300°C, 350°C, AND 400°C
X NO SAMPLE

ADHESIVES ON POLYMIDE FILMS AND METHODS OF PREPARING THEM

CROSS REFERENCE TO RELATED APPLICATIONS

This is a continuation-in-part of copending U.S. application Ser. No. 380,195, filed Jul. 17, 1989 now U.S. Pat. No. 5015719, which is in turn a continuation in part of U.S. application Ser. No. 154,861 filed Feb. 10, 1988 is now abandoned, which is a division of Ser. No. 33,557 filed Apr. 3, 1987, now U.S. Pat. No. 4,745,215.

FIELD OF THE INVENTION

This invention relates to microelectronic circuit packages, especially those having ductile, tear resistant, low dielectric constant, polymeric cores. More particularly the invention relates to a circuit package formed of interleaved organic polymeric films with thermosetting, dielectric adhesive there between. The microelectronic circuit package is built up of multiple thin dielectric layers formed of a composite of the thermosetting organic adhesive and the organic polymeric film.

A further aspect of the invention is the composite formed of the thermosetting organic adhesive and the organic polymeric film. The thermosetting, dielectric adhesives are used to provide adhesion between (1) organic films within an individual dielectric layer of the circuit package, and (2) a dielectric layer and the circuitization thereon.

These adhesive compositions are capable of being cured at reduced temperatures to form products such as adhesively bonded composites characterized by: 1) low dielectric constants, 2) high degradation temperatures, and 3) flame retardance properties.

BACKGROUND OF THE INVENTION

The general structures and manufacturing processes for electronic packages are described in, for example, Donald P. Seraphim, Ronald Lasky, and Che-Yo Li, *Principles of Electronic Packaging*, McGraw-Hill Book Company, New York, New York, (1988), and Rao R. Tummala and Eugene J. Rymaszewski, *Microelectronic Packaging Handbook*, Van Nostrand Reinhold, New York, N.Y. (1988), both of which are hereby incorporated herein by reference.

Electronic packages extend from the integrated circuit chip, through the module, card, and board, to the gate and system. The integrated circuit "chip" is referred to as the "zero order package." This chip or zero order package enclosed within its module is referred to as the first level of packaging. The integrated circuit chip provides circuit component to circuit component and circuit to circuit interconnection, heat dissipation, and mechanical integrity.

There is at least one further level of packaging. The second level of packaging is the circuit card. A circuit card performs at least four functions. First, the circuit card is employed because the total required circuit or bit count to perform a desired function exceeds the bit count of the first level package, i.e., the chip, and consequently, multiple chips are required to perform the function. Second, the circuit card provides for signal interconnection with other circuit elements. Third, the second level package, i.e., the circuit card, provides a site for components that are not readily integrated into the first level package, i.e., the chip or module. These components include, e.g., capacitors, precision resistors, inductors, electromechanical switches, optical couplers, and the like. Fourth, the second level package provides for thermal management, i.e., heat dissipation. Several cards may, in turn, be mounted on one board.

Cards and boards may be polymer based or ceramic based. A basic process for polymer based composite package fabrication is the "prepreg" process described by George P. Schmitt, Bernd K. Appelt and Jeffrey T. Gotro, "Polymers and Polymer Based Composites for Electronic Applications" in Seraphim, Lasky, and Li, *Principles of Electronic Packaging*, pages 334–371, previously incorporated herein by reference, and by Donald P. Seraphim, Donald E. Barr, William T. Chen, George P. Schmitt, and Rao R. Tummala, "Printed Circuit Board Packaging" in Tummala and Rymaszewski, *Microelectronics Packaging Handbook*, pages 853–922, also previously incorporated herein by reference.

In the "prepreg" process for polymeric electronic circuit package fabrication, a fibrous body, such as a non-woven mat or woven web, is impregnated with a laminating resin, i.e., an adhesive. This step includes coating the fibrous body with, for example, an epoxy resin solution, evaporating the solvents associated with the resin, and partially curing the resin. The partially cured resin is called a B-stage resin. The body of fibrous material and B stage resin is the prepreg. The prepreg, which is easily handled and stable, may be cut into sheets for subsequent processing.

Typical resins used to form the prepreg include epoxy resins, cyanate ester resins, polyimides, hydrocarbon based resins, and fluoropolymers. One type of prepreg is the FR-4 prepreg. FR-4 is a fire retardant epoxy-glass cloth material, where the epoxy resin is the diglycidyl ether of 2,2'-bis(4-hydroxyphenyl) propane. This epoxy resin is also known as the diglycidyl ether of bisphenol-A, (DGEBA). The fire retardancy of the FR-4 prepreg is obtained by including approximately 15–20 weight percent bromine in the resin. This is done by incorporating the appropriate amount of resins or other brominated compounds.

Still other bisphenol-A diglycidyl ether resins are used to form rigid circuit boards. Among the resins so used to produce "prepreg" for reinforced laminate compositions for circuit boards are the lower molecular weight bisphenol A diglycidyl ether epoxy resins, including bromine-substituted resins for imparting some degree of flame resistance as disclosed by U.S. Pat. No. 4,782,116. Such epoxy resins are of relatively low equivalent weight, in the area of 180 to 200, using non brominated resin for example, so that the epoxy group content is relatively high, i.e., each relatively short repeating unit contains two epoxy groups, which results in an increase in the dielectric constant of the compositions after curing.

Other epoxy resin formulations useful in providing prepregs include high functionality resins, such as epoxidized cresol novolacs, and epoxidized derivatives of tris (hydroxyphenyl) methane. The multifunctional epoxy resins are characterized by high glass transition temperatures, high thermal stability, and reduced moisture up take.

Phenolic cured epoxies, as Ciba-Giegy RD86-170 TM, Ciba-Giegy RD87-211 TM, Ciba-Giegy RD87-212 TM, Dow Quatrex® 5010 TM, Shell Epon® 1151 TM, and the like, are also used in forming prepregs. These epoxies are mixtures of epoxies, with each epoxy having a functionality of at least 2, a phenolic curing agent with a functionality of at least 2, and an imidazole catalyst.

Cyanate ester resins are also used in forming prepregs. One type of cyanate ester resin includes dicyanates reacted with methylene dianiline bis-maleimide. This product may also be reacted with compatible epoxides to yield a three component laminate material. One such laminate material is a 50:45:5 (parts by weight) of epoxy:cyanate:maleimide. Typical of cyanate ester resins useful in forming prepregs is the product of bis-phenol-A dicyanate and epoxy, which polymerizes during lamination to form a crosslinked structure.

One polyimide used for the film to carry the adhesive in a film- adhesive system, is a polyimide based on diphenylene dianhydride, described in U.S. Pat. No. 4,725,484 Kiyoshi Kumagawa, Kenji Kuniyasu, Toshiyuki Nishino, and Yuji Matsui for DIMENSIONALLY STABLE POLYIMIDE FILM AND PROCESS FOR PREPARATION THEREOF. This patent describes a copolymer of 3,3',4,4'- biphenylenetetracarboxylic dianhydride and p-phenylene diamine, commercially known as Upilex ® S.

Some proposed adhesive mixtures contain substantial amounts of the epoxy resin relative to the dicyanate polymer(s), producing an even higher dielectric constant. Also in such compositions the glass transition temperature and processing or curing temperature generally are reduced to such an extent that the thermal stability of the cured prepregs or laminates is unsatisfactory for high temperature processing applications.

However, the presently known film-adhesive systems and fiber-adhesive systems suffer from shortcomings. For example, epoxy-glass systems have a relatively high dielectric constant, and relatively poor thermal stability, while polyimide-glass systems have a poor copper peel strength. Attempts to substitute polymeric fibers or films for the glass fibers have introduced problems of microcracking and poor mechanical properties.

OBJECTS OF THE INVENTION

Thus, it is one object of the invention to provide a polymeric organic film-adhesive composite for microelectronic circuit packages having a low dielectric constant with relatively good thermal stability and mechanical properties.

Another object of our invention is to provide a low dielectric constant, thermally stable composite of a polyimide with a dicyanate-diepoxy adhesive for microelectronic circuit packages.

SUMMARY OF THE INVENTION

The deficiencies of the prior art are obviated and the objects of the invention obtained by the compositions and method of the invention. According to the invention a polymeric film carrying a thin film adhesive resin is provided where the resin and the polymeric films synergistically interact to provide a low dielectric constant, high thermal stability, and high mechanical strength.

The resin is a polymeric product of (a) diglycidyl bis phenol p-dialkyl benzene, and (b) dicyanate diphenyl hexafluoro isopropane. Preferably the resin contains from about 5 to 40 weight percent of diglycidyl bis phenol p-dialkyl benzene, and about 60 to 95 weight percent dicyanate diphenyl hexafluoro isopropane.

This resin is present as a thin film on a polymeric thin film, forming an organic polymeric dielectric composite. This composite is formed of an organic polymeric polyimide thin film and the organic polymeric adhesive reaction product of (i) diglycidyl bis phenol p-dialkyl benzene, and (ii) dicyanate diphenyl hexafluoro isopropane. The organic polymeric thin film acts as a support layer, supporting and reinforcing the adhesive thin film.

In a preferred exemplification of the invention the organic polymeric film is a polyimide. A particularly preferred polyimide thin film is the copolymer of 3,3',4,4'-biphenylenetetracarboxylic dianhydride and a diamine, such as p-phenylene diamine, 4,4' diamino phenyl oxide, and mixtures thereof.

The composite is particularly useful as a layer in an electronic circuit package, such as a multilayer printed circuit card or board. For example, the electronic circuit package is capable of and adapted to receive at least one microelectronic integrated circuit chip. The IC chip has signal leads, a power lead, and a ground lead communicating with corresponding circuit elements in the circuit package. The circuit package is a laminate of individual cores, at least one layer or core comprising a substrate of the above described organic polymeric dielectric composite.

According to a still further exemplification of the invention there is provided a method of fabricating a circuit board layer. This method includes the steps of providing a polyimide thin film, and contacting, to coat and/or impregnate the polyimide thin film with the adhesive composition of the invention. Subsequently, the so treated, i.e., coated and/or impregnated, polyimide thin film is partially cured to form a film based prepreg. This step, and subsequent steps, may be carried out in apparatus used to form conventional prepreg. Subsequent steps include building up a layer of several plies of adhesive-polyimide thin film-adhesive to form a circuit board layer, circuitizing the circuit board layer, and laminating the circuit board layer to another circuit board layer. It is of course to be understood that circuitization and lamination are carried out in various sequences to form power cores, internal circuitization, external circuitization, and contacts, leads, and housings.

FIGURES

The invention may be understood by reference to the FIGS.

DETAILED DESCRIPTION

According to the invention a polymeric film reinforced resin is provided where the resin and the polymeric films synergistically interact to provide a low dielectric constant, high thermal stability, and high mechanical strength.

The resin is a polymeric product of (a) diglycidyl bis phenol p-dialkyl benzene having the formula represented by:

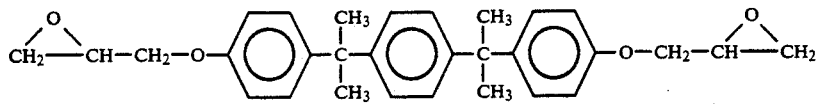

and (b) dicyanate diphenyl hexafluoro isopropane, having a structure represented by:

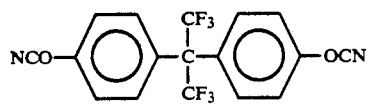

Preferably the resin contains from about 5 to 40 weight percent of diglycidyl bis phenol p-dialkyl benzene, and about 60 to 95 weight percent dicyanate diphenyl hexafluoro isopropane.

This resin is supported and reinforced by a polymeric polyimide thin film in an organic polymeric dielectric composite. This composite is formed of organic polymeric film, as will be described more fully hereinbelow, and the organic polymeric adhesive reaction product of (i) diglycidyl bis phenol p-dialkyl benzene, and (ii) dicyanate diphenyl hexafluoro isopropane. The polymeric organic thin film acts as a supporting and reinforcing layer for the adhesive.

In a preferred exemplification of the invention the organic polymeric thin films comprise a polyimide. A particularly preferred polyimide film is the copolymer of 3,3',4,4'-biphenylenetetracarboxylic dianhydride and either 4,4'-diaminophenyloxide or p-phenylene diamine. This copolymer has the structure represented by:

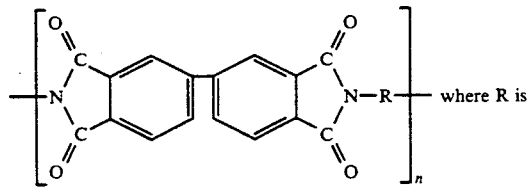 where R is

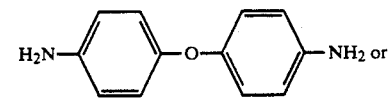 or

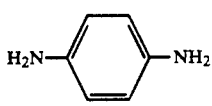

Figure 1:
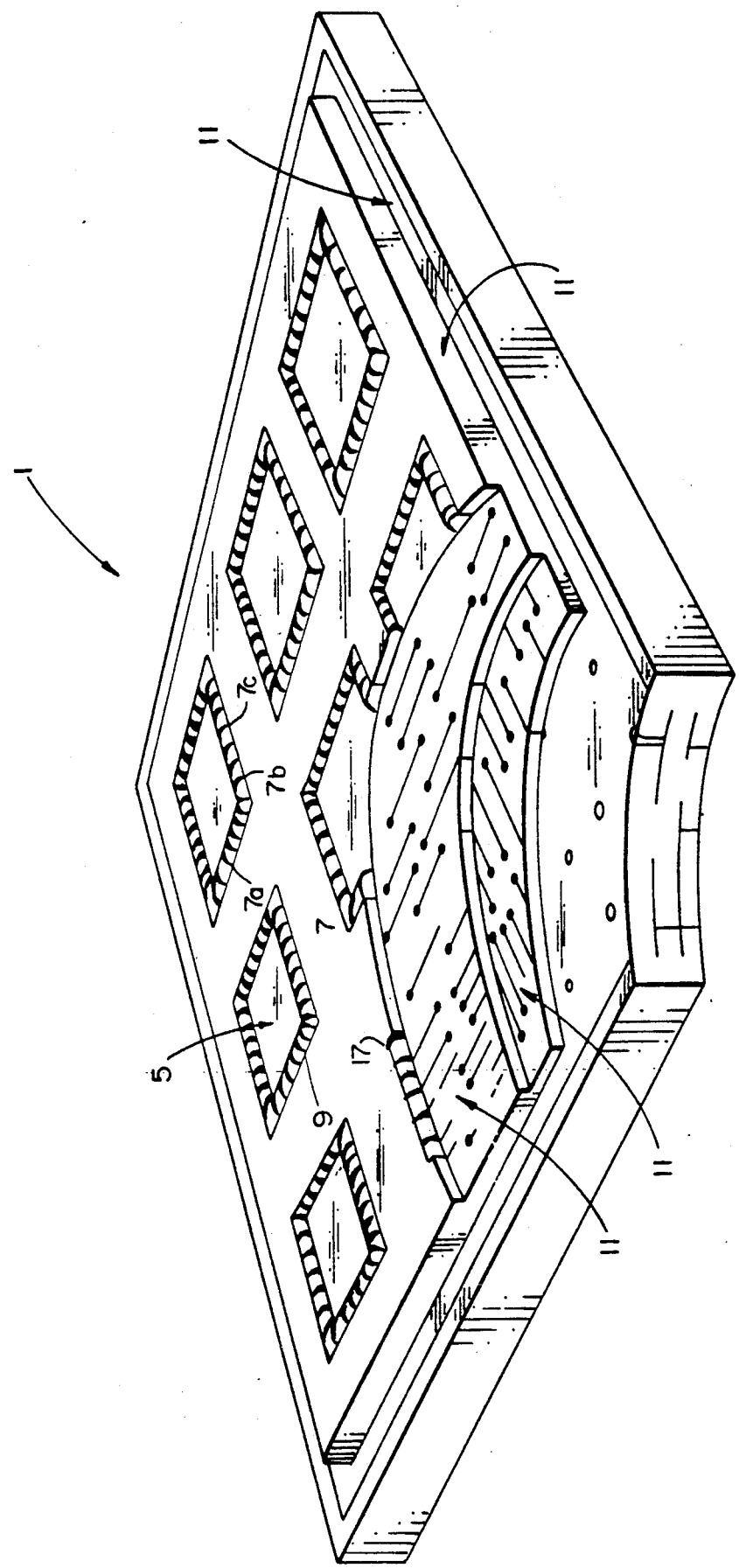
FIG. 1 is an isometric view, in partial cutaway, of a microelectronic circuit package incorporating the organic polymeric dielectric of the invention.

The composite is particularly useful as a layer in a printed circuit card or board used in electronic packaging. For example, the printed circuit board or card, 1, shown in FIG. 1, and also referred to as an electronic circuit package, is capable of and adapted to receive at least one microelectronic integrated circuit chip, 5. The IC chip, 5, has leads, 7, for example, signal leads, 7a, a power lead, 7b, and a ground lead, 7c, communicating with corresponding circuit elements in the circuit package, 1, through a chip carrier, 9. The circuit package, 1, is a laminate of individual cores, 11, at least one layer or core 11 comprising a substrate of the above described organic polymeric dielectric composite. Individual layers, 11, of the package 1 may carry power cores, buried signal circuitization, or external signal circuitization 17.

Figure 2:
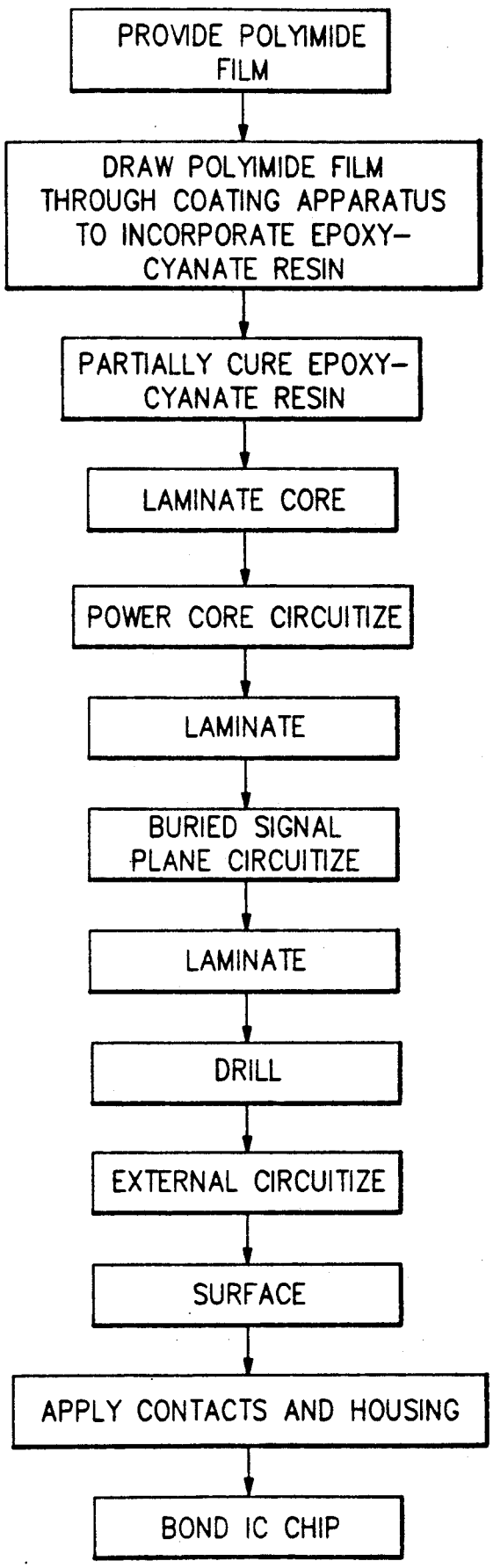
FIG. 2 is a flow chart of a method for fabricating a microelectronic circuit package incorporating the organic polymeric dielectric of the invention.

According to a still further exemplification of the invention, illustrated in the flow chart of FIG. 2, there is provided a method of fabricating a circuit board layer, and even a complete circuit board or card. This method includes the steps of providing an organic polymeric thin film, that is, a coated polyimide film. This thin film is fed through a dip tank or bath of the adhesive precursors. In the case of the instant invention this is a bath of 5 to 40 weight percent Shell Chemical Company RSL-1107 TM diglycidyl bis phenol p-dialkyl benzene, 60 to 95 weight percent Hi-Tek Polymers, Inc., dicyanate diphenyl hexafluoro isopropane, and 0.05 parts of zinc octoate (8 weight percent zinc in mineral spirits) per hundred parts of resin as the catalyst.

The next part of the impregnation step is heating the wet film to drive off solvents, and subsequent polymerization of the adhesive. Polymerization may be carried out by heating the wet film hot enough to react the monomeric constituents of the adhesive and form a pre-polymer, or B-stage resin. This is about 140 degrees C. for about 5 minutes.

Alternatively, pressing or even lamination can be combined with polymerization. Thus, the pre-polymer may be polymerized at a temperature of about 200 degrees Centigrade or higher for about 30 minutes, in a lamination press at an applied pressure of about 150 pounds per square inch to about 300 pounds per square inch. Lamination and curing may, alternatively, be carried out in multiple steps, for example in a two-step process, such as 30 minutes at 200 degrees Centigrade followed by 30 minutes at 250 to 300 degrees Centigrade.

Subsequent steps include core lamination, power core circuitization, buried signal circuitization, panel lamination, external circuitization, and application of contacts. It is of course to be understood that circuitization and lamination are carried out in various sequences to form power cores, internal circuitization, external circuitization, and contacts, leads, and housings.

The present invention is based upon the discovery that certain high molecular weight epoxy resin precursors having an epoxide equivalent weight of from about 185 to about 260 can be reacted with dicyanate diphenyl hexafluoro isopropane monomers or prepolymers to produce a low dielectric constant, adhesive reaction product that synergistically interacts with low dielectric constant polymeric films to produce a low dielectric constant composite which provides (i) thermal stability under microelectronic circuit package fabrication conditions, and (ii) thermal, adhesive, and elastic properties to be non-brittle and free of microcracks.

While in a preferred exemplification of our invention the novel dicyanate-epoxy blend compositions of the present invention are cured in the presence of polymeric films, as polyimide films, to form organic, polymeric circuit boards having low dielectric constants, it is to be understood that the novel dicyanate-epoxy blend compositions may also be used to provide adhesion for circuit board layers.

Aromatic fluorinated dicyanates generally polymerize by cyclotrimerization to form highly cross-linked heterochain polymers having high temperature stability, low dielectric constants, high glass transition temperatures and flame retardance ratings of UL94 V-0.

Diepoxide compounds and prepolymers generally polymerize by opening of the epoxide groups to form hydroxyl-terminated polyether chains.

Blending of the present aromatic dicyanates with minor amounts, from about 5 percent up to about 40 percent by weight of the mixture, of aromatic epoxy prepolymers having the formula:

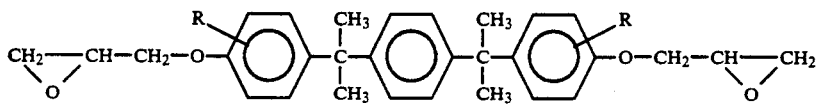

where R is H or lower alkyl, preferably methyl, is believed to cause the epoxide groups to react with excess aromatic cyanate groups in the mixture to form five membered ring oxazoline groups during cross-linking or curing. The formation of these five member rings eliminates or substantially reduces the number of hydroxy groups formed from the number that would normally be formed during the curing of epoxy resins.

The preferred epoxy resin precursor is diglycidyl-α,α′ bis (4-hydroxyphenyl)-p-diisopropyl benzene which has the formula given herein above, in which each R group is methyl, or an oligomer thereof.

The presence of more epoxy functionality than aromatic dicyanate functionality, or the use of epoxide resins having an epoxide equivalent weight lower than about 200 results in the formation of larger numbers of polar groups in the cured resin and a substantial and undesirable increase in the dielectric constant. Polymers containing more than about 40% by weight of the epoxy component are not satisfactory for polyimide film containing prepregs and circuit boards requiring low dielectric constant and high thermal stability properties or flame retardance ratings of UL94 V-0 or V-1.

The preferred aromatic dicyanates used according to the present invention are the fluorinated dicyanates disclosed in U.S. Pat. No. 4,745,215, most particularly 6-F bisphenol A dicyanate. Such material, when used alone that is, without epoxide functionality, and impregnated into conventional E-glass reinforcing fabric and cured at 250° C., has a glass transition temperature of about 240°-260° C., a dielectric constant of about 3.3, moisture absorption of 0.45% at room temperature and thermal stability represented by a 1.0% weight loss at 350° C. and 7.8% at 400° C. (isothermal, 1 hour) and a thermal degradation temperature of about 450° C. Moreover such material is flame retardant and has a flammability rating of UL94 V-0.

By way of contrast, when 0 to 40 weight percent diglycidyl bis phenol p-dialkyl benzene is blended with dicyanate diphenyl hexafluoro isopropane, and is coated onto and/or impregnated into a thin film of Ube Industries Ltd. Upilex® R polyimide copolymer of 3,3′,4,4′-biphenylenetetracarboxylic dianhydride and p-phenylene diamine to form the composite of the invention, the resulting adhesive and composite have the properties in Table I.

The similar non-fluorinated aromatic dicyanates cannot be used according to the present invention since they require the addition of conventional flame retardant materials such as brominated polyvinyl benzyl ether or brominated diphenyl in order to impart flame retardant properties, and such additives substantially influence the dielectric constant. However, this does not preclude the use of non-fluorinated aromatic dicyanates such as bisphenol A dicyanate in admixture with the fluorinated dicyanates.

In addition to the fluorinated dicyanate and epoxy resin precursor, the present compositions also preferably include a suitable conventional polymerization catalyst such as octoates and naphthenates, exemplified by solutions of zinc, cobalt, copper, or manganese octoates or naphthenates, and by the more latent acetylacetonates dissolved in nonylphenol.

Having described the basic concepts of the present invention, reference is now made to the following examples, which are provided by way of illustration, and not by way of limitation, of the practice of the present invention. All parts and percents are by weight unless otherwise specified.

EXAMPLE 1

A resin composition is prepared containing 40 parts by weight of Shell Chemical Company RSL-1107 TM diglycidyl bis phenol p-dialkyl benzene, 80 parts by weight of Hi-Tek Polymers, Inc. Arocy-40S TM dicyanate diphenyl hexafluoro isopropane, and 0.03 parts by weight of zinc octoate (8 weight percent zinc in mineral spirits) in 90 parts by weight methyl ethyl ketone. This resin composition is applied to a 2 mil thick film of Ube Industries, Ltd. Upilex SGA TM.

The wet film is heated to 140 degrees Centigrade for two-three minutes to B-stage the resin. In this way a composite is obtained having an adherent film of an epoxide-cyanate thin film B-stage resin on a thin polyimide film. The composite structure is then layered between sheets of 1 ounce copper foil, placed in a heated press, and heated to 200 degrees Centigrade for 30 minutes, and thereafter to 250 to 300 degrees Centigrade for 30 minutes while maintaining a pressure of 150 to 300 pounds per square inch.

A cured laminate is obtained having an adherent epoxide-cyanate film on a thin polyimide film.

EXAMPLE 2

A resin composition is prepared containing 20 parts by weight of Shell Chemical Company RSL-1107 TM diglycidyl bis phenol p-dialkyl benzene, 106.4 parts by weight of Hi-Tek Polymers, Inc. Arocy-40S TM dicyanate diphenyl hexafluoro isopropane, and 0.05 parts by weight of zinc octoate (8 weight percent zinc in mineral spirits) in 90 parts by weight methyl ethyl ketone. This resin composition is applied to a 2 mil thick film of Ube Industries, Ltd. Upilex SGA TM.

The wet film is heated to 140 degrees Centigrade for two-three minutes to B-stage the resin. In this way a composite is obtained having an adherent film of an epoxide-cyanate thin film B-stage resin on a thin polyimide film. The composite structure is then layered between sheets of 1 ounce copper foil. The composite structure is then placed in a heated press, and heated to 200 degrees Centigrade for 30 minutes, and thereafter to 250 to 300 degrees Centigrade for 30 minutes while maintaining a pressure of 150 to 300 pounds per square inch.

A cured laminate is obtained having an adherent epoxide-cyanate film on a thin polyimide film.

While the invention has been described with respect to preferred embodiments and exemplifications, it is not intended to limit the scope of the invention thereby, but solely by the claims appended hereto.

We claim:

1. An electronic circuit package adapted to receive at least one microelectronic circuit chip having signal leads, a power lead, and a ground lead; said circuit package comprising a laminate of individual cores, at least one core comprising a substrate of an organic polymeric dielectric composite comprising:
   (a). an organic polymeric film; and
   (b). an organic copolymeric adhesive reaction product of
      (i) diglycidyl bis phenol p-dialkyl benzene, and
      (ii) dicyanate diphenyl hexafluoro isopropane, said organic film carrying and reinforcing said copolymeric adhesive, said internal core having Cu circuitization adapted to co-operate with at least one of said leads on at least one surface thereof.

2. The electronic circuit package of claim 1 wherein the organic copolymeric adhesive comprises from about 5 to 40 weight percent of diglycidyl bis phenol p-dialkyl benzene, and about 60 to 95 weight percent dicyanate diphenyl hexafluoro isopropane.

3. The electronic circuit package of claim 2 wherein the organic polymeric films comprise a polyimide.

4. The electronic circuit package of claim 3 wherein the films comprise a polyimide having moieties of: (i) 3,3',4,4'-biphenylene tetracarboxylic dianhydride and (ii) a diamine chosen from the group consisting of p-phenylene diamine, 4,4'-diamino phenyl oxide, and mixtures thereof.

* * * * *